United States Patent
Nam

(10) Patent No.: US 7,220,641 B2
(45) Date of Patent: May 22, 2007

(54) METHOD FOR FABRICATING STORAGE ELECTRODE OF SEMICONDUCTOR DEVICE

(75) Inventor: Ki Won Nam, Gyeonggi-do (KR)

(73) Assignee: Hynix Semiconductor, Inc., Icheon-Si, Gyeonggi-Do ( * ) Notice: Subject to any disclaimer, the term of this patent is extended or adjusted under 35 U.S.C. 154(b) by 1 day.

(21) Appl. No.: 11/147,249

(22) Filed: Jun. 8, 2005

(65) Prior Publication Data

US 2005/0272234 A1    Dec. 8, 2005

(30) Foreign Application Priority Data

Jun. 8, 2004    (KR) .................. 10-2004-0041805

(51) Int. Cl.
*H01L 21/8242*    (2006.01)
(52) U.S. Cl. .................. 438/253; 438/396; 438/584; 257/E21.209
(58) Field of Classification Search ........... 438/253, 438/396, 584
See application file for complete search history.

(56) References Cited

U.S. PATENT DOCUMENTS

| 5,352,623 | A | * | 10/1994 | Kamiyama | 438/396 |
| 5,661,056 | A | * | 8/1997 | Takeuchi | 438/261 |
| 5,747,357 | A | * | 5/1998 | Su | 438/448 |
| 6,509,244 | B2 | * | 1/2003 | Kim et al. | 438/386 |
| 6,562,679 | B2 | * | 5/2003 | Lee et al. | 438/253 |

FOREIGN PATENT DOCUMENTS

| KR | 2000-7541 | 2/2000 |
| KR | 2003-49942 | 6/2003 |

\* cited by examiner

*Primary Examiner*—Asok K. Sarkar
*Assistant Examiner*—Victor V. Yevsikov
(74) *Attorney, Agent, or Firm*—Johnny A. Kumar; Justin T. Darrow; Heller Ehrman, LLP

(57) ABSTRACT

The present invention discloses improved method for manufacturing semiconductor device wherein a barrier layer is formed by thermally treating a hard mask polysilicon layer for protecting the sacrificial oxide film and the hard mask polysilicon film from damages.

4 Claims, 2 Drawing Sheets

METHOD FOR FABRICATING STORAGE ELECTRODE OF SEMICONDUCTOR DEVICE

BACKGROUND OF THE INVENTION

1. Field of the Invention

The present invention relates to method for fabricating storage electrode of semiconductor device, and in particular to an improved method for fabricating storage electrode semiconductor device wherein a barrier layer is formed by thermally treating a hard mask polysilicon layer for protecting the sacrificial oxide film and the hard mask polysilicon film from damages.

2. Description of the Background Art

FIG. 1 is a cross-sectional view illustrating a method for fabricating a storage electrode of semiconductor device.

Referring to FIG. 1, a sacrificial oxide film 20, a hard mask polysilicon film 30 are sequentially deposited on a semiconductor substrate 10 including a storage node contact plug (not shown). Thereafter, the hard mask polysilicon film 30 and the sacrificial oxide film 20 are etched to form a storage electrode region. A storage electrode (not shown) is then formed in the storage electrode region. The thickness of the sacrificial oxide film 20 should be more than 15000 Å. As the thickness of the sacrificial oxide film 20 is increased, a time period required for etching the sacrificial oxide film 20 is also increased, whereby the thickness of the hard mask polysilicon film 30 must also be increased. However, the hard mask polysilicon film 30 cannot be formed to have more than a predetermined thickness due to limitation in process margin. Therefore, the hard mask polysilicon film 30 is damaged due to over-etching during the etching process of the sacrificial oxide film 20, which causes a bridge between adjacent storage electrodes.

SUMMARY OF THE INVENTION

Accordingly, it is an object of the present invention to provide a method for fabricating of storage electrode of semiconductor device, wherein the barrier layer is formed by thermally treating the hard mask polysilicon layer for protecting the sacrificial oxide film and the hard mask polysilicon film from damages, thereby preventing bridge between adjacent storage electrodes.

In order to achieve the above-described object of the invention, there is provided a method for fabricating of storage electrode of semiconductor device, the method comprising the steps of:

forming a sacrificial oxide film on a semiconductor substrate including a storage node contact plug;

forming a hard mask polysilicon film on the sacrificial oxide film;

performing a thermal treatment under a gas atmosphere containing nitrogen to form a barrier layer on a surface of the hard mask polysilicon film;

etching the barrier layer, the hard mask polysilicon film and the sacrificial oxide film to form a storage electrode region; and forming a storage electrode in the storage electrode region.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for fabricating a storage electrode of semiconductor device will now be described in detail with reference to the accompanying drawings.

Figure 1:
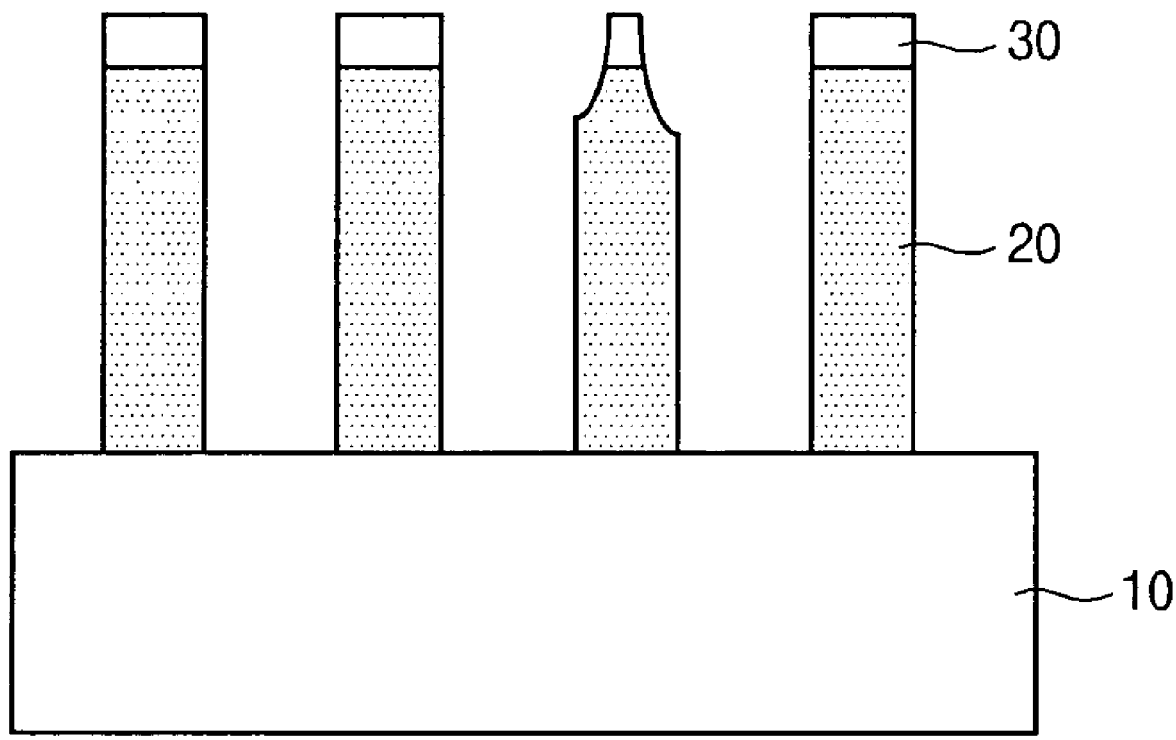
FIG. 1 is a cross-sectional view illustrating a method for fabricating a storage electrode of semiconductor device.
Figure 2A:
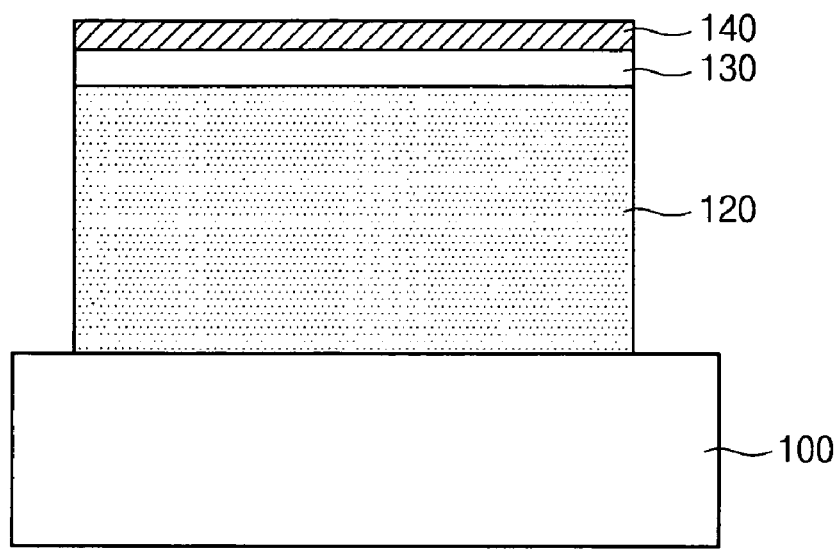
FIGS. 2a and 2b are cross-sectional views method for fabricating a storage electrode of semiconductor device in accordance with the present invention.
Figure 2B:
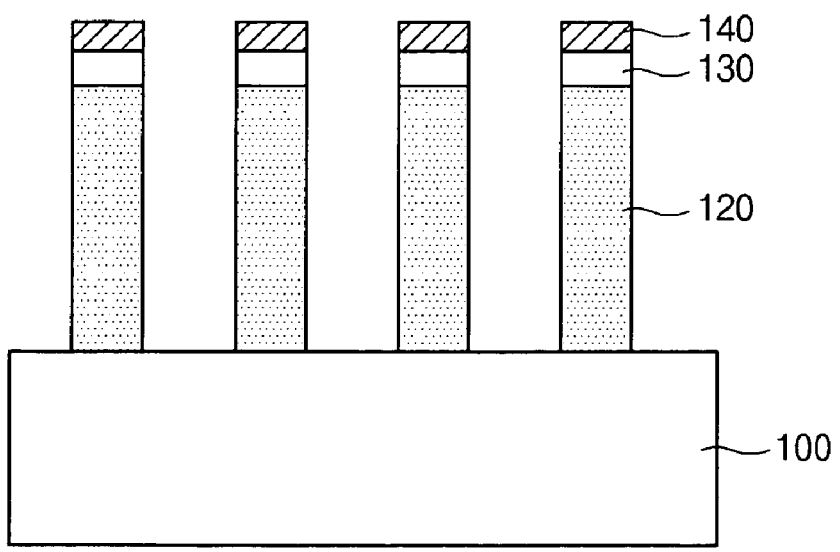

FIGS. 2a and 2b are cross-sectional views method for fabricating a storage electrode of semiconductor device in accordance with the present invention.

Referring to FIG. 2a, a sacrificial oxide film 120 is formed on a semiconductor substrate 100 including a storage node contact plug (not shown). Thereafter, a hard mask polysilicon film 130 is formed on the sacrificial oxide film 120. A surface of the hard mask polysilicon film 130 is then subjected to a thermal treatment under a gas atmosphere containing nitrogen to form a barrier layer 140. Preferably, the gas atmosphere containing nitrogen includes $NH_3$ gas, $N_2O$ gas or a mixture gas of $NH_2$ and $O_2$. The thermal treatment is preferably performed at a temperature ranging from 600 to 850° C. and a thickness of the barrier layer 140 formed by the thermal treatment ranges from the lower gate electrode 100 to 300 Å.

Generally, a polysilicon includes a Si—Si lattice bond. When a polysilicon layer is subjected to a thermal treatment under the gas atmosphere containing nitrogen includes $NH_3$ gas, $N_2O$ gas or a mixture gas of $NH_2$ and $O_2$, the surface of the polysilicon film is converted to include a lattice bond of Si—O—N, Si—N or Si—O. Therefore, the surface of the hard mask polysilicon film 130 is converted to include a lattice bond of Si—O—N, Si—N or Si—O which provides a similar film characteristic as that of a nitride film, thereby protecting the hard mask polysilicon film 130 during the etching process of the sacrificial oxide film 120.

Referring to FIG. 2b, the barrier layer 140, the hard mask polysilicon film 130 and the sacrificial oxide film 120 are etched to form a storage electrode region. The barrier layer 140 protects the hard mask polysilicon film 130 from damages due to over-etching. A storage electrode is then formed in the storage electrode region.

As discussed earlier, in accordance with the present invention, the barrier layer is formed by thermally treating the hard mask polysilicon layer for protecting the sacrificial oxide film and the hard mask polysilicon film from damages, thereby preventing bridge between adjacent storage electrodes.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for fabricating storage electrode of semiconductor device, the method comprising the steps of:
   forming a sacrificial oxide film on a semiconductor substrate including a storage node contact plug;
   forming a hard mask polysilicon film on the sacrificial oxide film;
   performing a thermal treatment under a gas atmosphere containing nitrogen to form a barrier layer on a surface of the hard mask polysilicon film;
   etching the barrier layer, the hard mask polysilicon film and the sacrificial oxide film where a storage electrode is to be formed to form a storage electrode region exposing the storage node contact plug; and
   forming the storage electrode in the storage electrode region.

2. The method according to claim 1, wherein the thermal treatment is performed under the gas atmosphere containing $NH_3$ gas, $N_2O$ gas or a mixture gas of $NH_2$ and $O_2$ at a temperature ranging from 600 to 850° C.

3. The method according to claim 1, wherein a thickness of the barrier layer ranges from about 100 to about 300 Å.

4. The method according to claim 1, wherein the barrier layer comprises a lattice bond of Si—O—N, Si—N or Si—O.

* * * * *